(12) United States Patent
Sorabji et al.

(10) Patent No.: US 8,222,574 B2
(45) Date of Patent: Jul. 17, 2012

(54) TEMPERATURE MEASUREMENT AND CONTROL OF WAFER SUPPORT IN THERMAL PROCESSING CHAMBER

(75) Inventors: Khurshed Sorabji, San Jose, CA (US);
Alexander Lerner, San Jose, CA (US);
Joseph Ranish, San Jose, CA (US);
Aaron Hunter, Santa Cruz, CA (US);
Bruce Adams, Portland, OR (US);
Mehran Behdjat, San Jose, CA (US);
Rajesh Ramanujam, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1015 days.

(21) Appl. No.: 12/055,045

(22) Filed: Mar. 25, 2008

(65) Prior Publication Data

US 2008/0169282 A1 Jul. 17, 2008

Related U.S. Application Data

(63) Continuation-in-part of application No. 11/623,238, filed on Jan. 15, 2007, now Pat. No. 7,860,379.

(51) Int. Cl.
*H05B 3/68* (2006.01)
*F26B 3/30* (2006.01)
*C23C 16/00* (2006.01)

(52) U.S. Cl. ............ 219/444.1; 392/418; 118/725

(58) Field of Classification Search .......... 219/443.1, 219/444.1; 392/416, 418; 118/724, 725
See application file for complete search history.

(56) References Cited

U.S. PATENT DOCUMENTS

| | | | |
|---|---|---|---|
| 3,293,868 A * | 12/1966 | Gonzalez | 62/3.1 |
| 4,047,496 A * | 9/1977 | McNeily et al. | 118/725 |
| 5,399,523 A | 3/1995 | Kakoschke | |
| 5,508,532 A | 4/1996 | Teramoto | |
| 5,530,265 A | 6/1996 | Takemura | |
| 5,648,277 A | 7/1997 | Zhang et al. | |
| 5,660,472 A | 8/1997 | Peuse et al. | |
| 5,712,495 A | 1/1998 | Suzawa | |
| 5,719,065 A | 2/1998 | Takemura et al. | |
| 5,755,511 A | 5/1998 | Peuse et al. | |
| 5,848,842 A | 12/1998 | Peuse et al. | |
| 5,892,236 A | 4/1999 | Takahashi et al. | |
| 5,937,142 A | 8/1999 | Moslehi et al. | |

(Continued)

FOREIGN PATENT DOCUMENTS

EP 1 944 793 A2 7/2008
(Continued)

OTHER PUBLICATIONS

PCT International Search Report and Written Opinion for PCT/US2009/038156, (Jun. 26, 2009), 10 pgs.

(Continued)

*Primary Examiner* — Sang Paik
(74) *Attorney, Agent, or Firm* — Diehl Servilla LLC; Jeffrey I. Blankman; Scott S. Servilla

(57) ABSTRACT

Apparatus and methods for achieving uniform heating or cooling of a substrate during a rapid thermal process are disclosed. More particularly, apparatus and methods for controlling the temperature of an edge ring supporting a substrate and/or a reflector plate during a rapid thermal process to improve temperature uniformity across the substrate are disclosed, which include a thermal mass or plate adjacent the edge ring to heat or cool the edge ring.

19 Claims, 5 Drawing Sheets

U.S. PATENT DOCUMENTS

| | | | |
|---|---|---|---|
| 5,945,711 | A | 8/1999 | Takemura et al. |
| 6,001,756 | A | 12/1999 | Takahashi et al. |
| 6,007,241 | A | 12/1999 | Yam et al. |
| 6,013,236 | A | 1/2000 | Takahashi et al. |
| 6,073,681 | A * | 6/2000 | Getchel et al. ............... 165/80.1 |
| 6,087,245 | A | 7/2000 | Yamazaki et al. |
| 6,090,210 | A * | 7/2000 | Ballance et al. ............. 118/725 |
| 6,090,733 | A | 7/2000 | Otsuki et al. |
| 6,133,550 | A | 10/2000 | Griffiths et al. |
| 6,156,628 | A | 12/2000 | Ohnuma et al. |
| 6,187,704 | B1 | 2/2001 | Takahashi et al. |
| 6,188,044 | B1 | 2/2001 | Lee et al. |
| 6,200,388 | B1 | 3/2001 | Jennings |
| 6,214,755 | B1 | 4/2001 | Otsuki et al. |
| 6,215,106 | B1 | 4/2001 | Boas et al. |
| 6,217,969 | B1 | 4/2001 | Takahashi et al. |
| 6,261,370 | B1 | 7/2001 | Otsuki et al. |
| 6,303,411 | B1 | 10/2001 | Camm et al. |
| 6,350,964 | B1 | 2/2002 | Boas et al. |
| 6,375,348 | B1 | 4/2002 | Hebb et al. |
| 6,375,752 | B1 | 4/2002 | Otsuki et al. |
| 6,376,804 | B1 | 4/2002 | Ranish et al. |
| 6,393,210 | B1 | 5/2002 | Wu |
| 6,406,179 | B2 | 6/2002 | Adams et al. |
| 6,429,104 | B1 | 8/2002 | Auberton-Herve |
| 6,466,426 | B1 | 10/2002 | Mok et al. |
| 6,468,879 | B1 | 10/2002 | Lamure et al. |
| 6,471,913 | B1 | 10/2002 | Weaver et al. |
| 6,476,362 | B1 | 11/2002 | Deacon et al. |
| 6,478,937 | B2 | 11/2002 | Olgado et al. |
| 6,500,266 | B1 | 12/2002 | Ho et al. |
| 6,534,752 | B2 | 3/2003 | Camm et al. |
| 6,570,134 | B2 | 5/2003 | Suzuki et al. |
| 6,570,137 | B1 | 5/2003 | Jennings |
| 6,576,065 | B1 | 6/2003 | Lamure |
| 6,599,818 | B2 | 7/2003 | Dairiki |
| 6,723,202 | B2 | 4/2004 | Nagaiwa et al. |
| 6,787,739 | B2 | 9/2004 | Lee et al. |
| 6,794,275 | B2 | 9/2004 | Kondo et al. |
| 6,800,833 | B2 | 10/2004 | Gregor et al. |
| 6,853,802 | B2 | 2/2005 | Neyret et al. |
| 6,868,302 | B2 | 3/2005 | Kobayashi et al. |
| 6,897,131 | B2 | 5/2005 | Ramachandran et al. |
| 6,908,540 | B2 | 6/2005 | Kholodenko |
| 6,919,271 | B2 | 7/2005 | Gat |
| 6,927,169 | B2 | 8/2005 | Maydan et al. |
| 6,962,732 | B2 | 11/2005 | Won et al. |
| 7,024,105 | B2 | 4/2006 | Fodor et al. |
| 7,127,367 | B2 | 10/2006 | Ramachandran et al. |
| 7,226,488 | B2 | 6/2007 | Gat |
| 7,860,379 | B2 * | 12/2010 | Hunter et al. .................. 392/416 |
| 2001/0017294 | A1 | 8/2001 | Aoki et al. |
| 2003/0000647 | A1 | 1/2003 | Yudovsky et al. |
| 2003/0015141 | A1 | 1/2003 | Takagi |
| 2005/0191044 | A1 | 9/2005 | Aderhold et al. |
| 2006/0066193 | A1 | 3/2006 | Ranish et al. |
| 2006/0228818 | A1 * | 10/2006 | Chacin et al. ................... 438/18 |
| 2006/0286807 | A1 | 12/2006 | Hwang et al. |
| 2007/0003279 | A1 | 1/2007 | Park |

FOREIGN PATENT DOCUMENTS

JP      2002134429      5/2002

OTHER PUBLICATIONS

Extended European Search Report and Opinion for EP 09 72 4111, dated Nov. 3, 2011, 8 pages.

* cited by examiner

TEMPERATURE MEASUREMENT AND CONTROL OF WAFER SUPPORT IN THERMAL PROCESSING CHAMBER

CROSS-REFERENCE TO RELATED APPLICATIONS

This application is a continuation-in-part of U.S. patent application Ser. No. 11/623,238, filed on Jan. 15, 2007, the contents of which are incorporated herein in their entirety.

BACKGROUND OF THE INVENTION

1. Field of the Invention

The present invention generally relates to the field of semiconductor processing. More particularly, the present invention relates to methods and apparatus for thermally processing a semiconductor substrate.

2. Background

The fabrication of integrated circuits from silicon or other wafers involves many steps of depositing layers, photo lithographically patterning the layers, and etching the patterned layers. Ion implantation is used to dope active regions in the semiconductive silicon. The fabrication sequence also includes thermal annealing of the wafers for many uses including curing implant damage and activating the dopants, crystallization, thermal oxidation and nitridation, silicidation, chemical vapor deposition, vapor phase doping, thermal cleaning, and other reasons. Although annealing in early stages of silicon technology typically involved heating multiple wafers for long periods in an annealing oven, rapid thermal processing, (RTP) has been increasingly used to satisfy the ever more stringent requirements for ever smaller circuit features. RTP is typically performed in single-wafer chambers by irradiating a wafer with light from an array of high-intensity lamps directed at the front face of the wafer on which the integrated circuits are being formed. The radiation is at least partially absorbed by the wafer and quickly heats it to a desired high temperature, for example above 600° C., or in some applications, above 1000° C. The radiant heating can be quickly turned on and off to controllably and uniformly heat the wafer over a relatively short period, for example, of a minute or less, or even a few seconds. RTP chambers are capable of uniformly heating a wafer at rates of about 50° C./second and higher, for example, at rates of 100°-150° C./second, and 200°-400° C./second. Typical ramp-down (cooling) rates in RTP chambers are in the range of 80-150° C./second. Some processes performed in RTP chambers require variations in temperature across the substrate of less than a few degrees Celsius.

Since rapid thermal processing works on a single semiconductor each time, optimal heating and cooling means are necessary for optimal RTP performance. It is desirable to optimize substrate temperature uniformity during thermal processing of the substrate. Temperature uniformity provides uniform process variables on the substrate (e.g. layer thickness, resistivity, etch depth) for temperature activated steps such as film deposition, oxide growth and etching. In addition, substrate temperature uniformity is necessary to prevent thermal stress-induced substrate damage such as warpage, defect generation and slip. For example, at 1150° C., a center to edge temperature difference on a four-inch silicon wafer of approximately 5° C. can induce dislocation formation and slip. Temperature gradients may also be induced by other sources. For example, a substrate may have non-uniform emissivity because of spatial modifications to surface areas or volumes of the substrate. These modifications may include films that have been patterned by photolithography or locally doped regions, such as buried layers for bipolar transistors. In addition, substrate temperature gradients may be induced by localized gas cooling or heating effects related to processing chamber design as well as non-uniform endothermic or exothermic reactions that may occur on the substrate surface during processing. It would be desirable to provide RTP chambers that provide improved temperature uniformity.

As noted above, RTP usually requires a substantially uniform temperature profile across the substrate. In the state of the art process, the temperature uniformity may be improved by controlling heat sources, such as a laser, an array of lamps, configured to heat the substrate on the front side while a reflective surface on the back side reflects heat back to the substrate. Emissivity measurement and compensation methodology have been used to improve the temperature gradient across the substrate.

As the semiconductor industry develops, the requirement for temperature uniformity during a RTP also increases. In some processes, it is important to have substantially small temperature gradient from about 2 mm inside the edge of the substrate. Particularly, it may be necessary to heat a substrate at a temperature between about 200° C. to about 1350° C. with a temperature deviation of about 1° C. to 1.5° C. The state of the art RTP systems have difficulties to reach this kind of uniformity, especially near the edge of the substrate. In a RTP system, an edge ring is usually used to support a substrate near the periphery. The edge ring and the substrate overlap producing a complicated heating situation near the edge of the substrate. In one aspect, the substrate may have different thermal properties near the edge. This is mostly pronounced for a patterned substrate, or for a silicon-on insulator- (SOI) substrate. In another aspect, the substrate and the edge ring overlap near the edge, it is difficult to achieve uniform temperature profile near the edge by measuring and adjusting the temperature of the substrate alone. Depending on the edge ring's thermal properties relative to the substrate's thermal and optical properties, the temperature profile of a substrate is generally either edge high or edge low.

FIG. 1 schematically illustrates two types of common temperature profiles of a substrate processed in a RTP chamber. The vertical axis denotes measured temperatures on a substrate. The horizontal axis denotes the distance from the edge of the substrate. Profile 1 is an edge high profile where the edge of the substrate has the highest temperature measurement. Profile 1 is an edge low profile where the edge of the substrate has the lowest temperature measurement. It is difficult to remove temperature deviation near the edge of the substrate in the state of the art RTP systems.

Residual heat remains in the RTP chamber after processing a wafer. One of the parts that is adversely affected is the wafer support (a.k.a. edge ring). To avoid breaking/warping wafers and improving wafer uniformity due to a hot edge ring, the wafer must be heated before it is placed on the edge ring, causing a decrease in the overall throughput. The wafer must be heated close to the edge ring temperature to avoid breaking or warping. Conversely, the edge ring may be cooled to achieve the same desired effect, which is to minimize the difference in temperature between the edge ring and the wafer.

Another benefit to controlling the edge ring temperature is observed during wafer processing. The edge ring temperature may be heated or cooled to minimize the difference in temperature between the edge ring and the wafer. This control would allow for better management of the discontinuity caused by the overlap of the wafer and the edge ring. This cannot be done as well with the current RTP lamp assembly because the radiation covers an area larger than the edge ring. Heat sources can be adapted to radiate substantially only the edge ring so the edge ring heating can be varied to accommodate its changing radiation heat characteristics relative to the wafer during the entire process cycle.

Therefore, there is a need for apparatus and methods used in RTP for improved temperature uniformity.

SUMMARY OF THE INVENTION

Embodiments of present invention generally provides apparatus and methods for achieving more uniform heating to a substrate during a rapid thermal process.

In one embodiment, a chamber for processing a substrate comprises a chamber enclosure defining a processing volume; a substrate support disposed in the processing volume; an edge ring disposed on the substrate support, the edge ring being configured to support the substrate on a periphery of the substrate; a first heat source configured to heat the substrate; a second heat source configured to change the temperature of the edge ring; and a thermal mass positioned adjacent the edge ring including at least one channel containing a fluid that heats or cool the thermal mass.

In one embodiment, the temperatures of the second heat source and the thermal mass are controlled independently. In an embodiment, the edge ring is cooled by positioning the edge ring proximate to the thermal mass. In one embodiment, the second heat source is one of a radiant heater, a conductive heat source, a resistive heater, an inductive heater, and a microwave heater.

In certain embodiments, the chamber further comprises a gas jet configured to direct a cooling gas towards the edge ring. In one embodiment, the first heat source and thermal mass are disposed on opposite sides of the edge ring. In other embodiments, the first heat source and thermal mass are disposed on the same side of the edge ring.

In an embodiment, the thermal mass comprises a reflector plate. The thermal mass may be in the shape of a toroid.

In another embodiment, a rapid thermal processing chamber comprises a chamber body defining a chamber volume; a temperature controlled edge ring disposed in the chamber volume, wherein the temperature controlled edge ring is thermally coupled with a substrate being processed near the periphery of the substrate; a first heat source configured for primarily changing the temperature of the substrate; a second heat source configured for primarily heating the temperature controlled edge ring; and a plate adjacent the edge ring having at least one channel containing a gas or liquid for heating or cooling the plate.

In one embodiment, the rapid thermal processing chamber further comprises a cooling device configured to cool the temperature controlled edge ring. In an embodiment, the first heat source and plate are disposed on opposite sides of the temperature controlled edge ring. In an embodiment, the edge ring is cooled by being in close proximity to the plate. In one or more embodiments, the temperatures of the first heat source, the second heat source and the plate are controlled independently.

Another aspect of the invention pertains to a method for uniformly heating or cooling a substrate to a target temperature, comprising positioning the substrate in a processing chamber connected to a first heat source; thermally coupling the periphery of the substrate to an edge ring; heating or cooling a surface of the substrate with a first heat source; and maintaining the edge ring at a ring temperature which differs from the target temperature with a temperature controlled plate adjacent to the edge ring, the temperature controlled plate including channel containing gas or liquid to heat or cool the plate The method may further include cooling the edge ring using a purge gas.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate typical embodiments of this invention and are therefore not to be considered limiting of its scope, for the invention may admit to other equally effective embodiments.

DETAILED DESCRIPTION

The present invention provides apparatus and methods for assisting in the achievement of uniform heating to a substrate during a rapid thermal process. More particularly, embodiments of the present invention provide apparatus and methods for controlling the temperature of an edge ring supporting a substrate during a rapid thermal process to improve temperature uniformity across the substrate.

Figure 1:
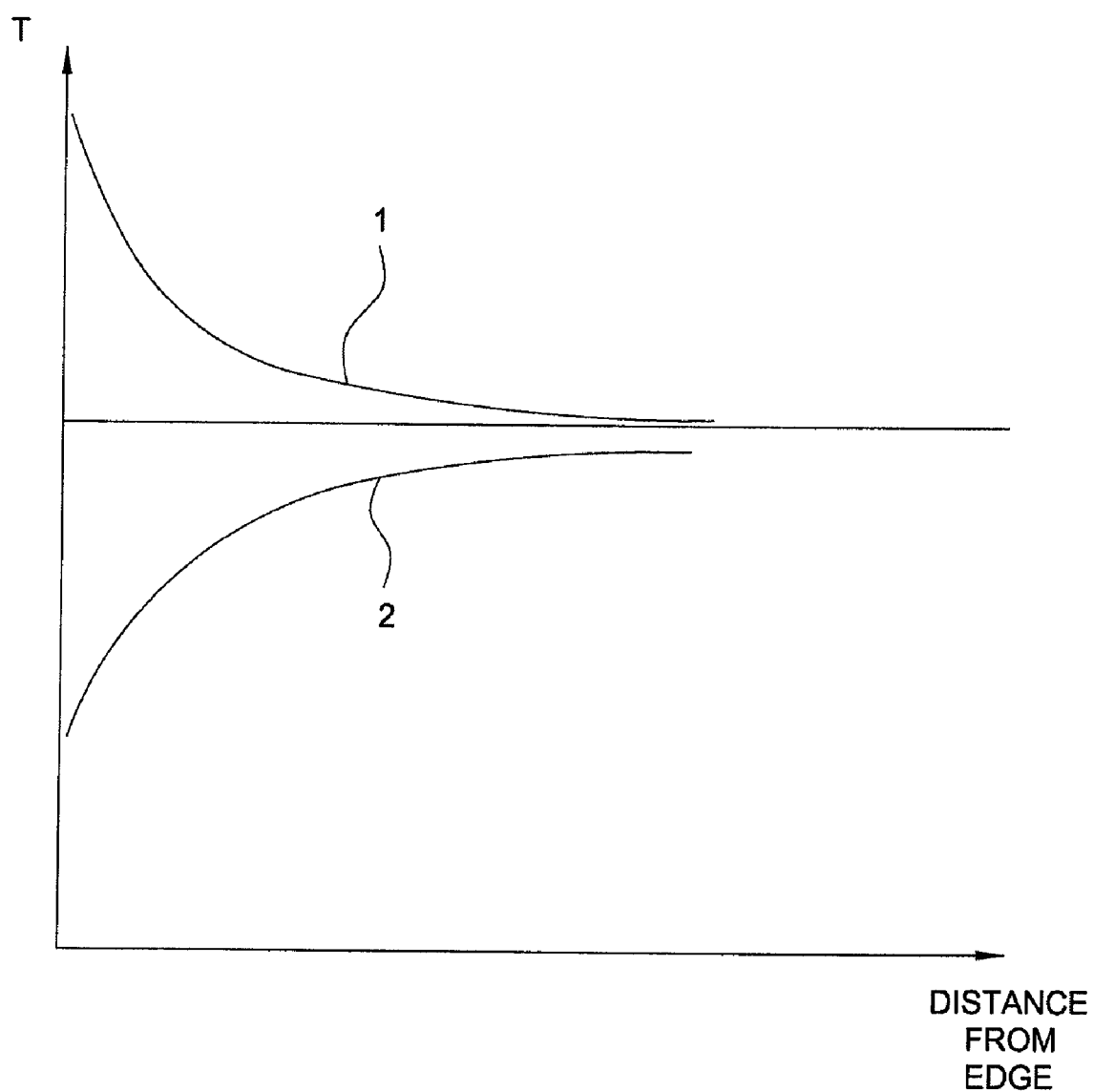
FIG. 1 schematically illustrates two types of common temperature profiles of a substrate processed in a RTP chamber.
Figure 2:
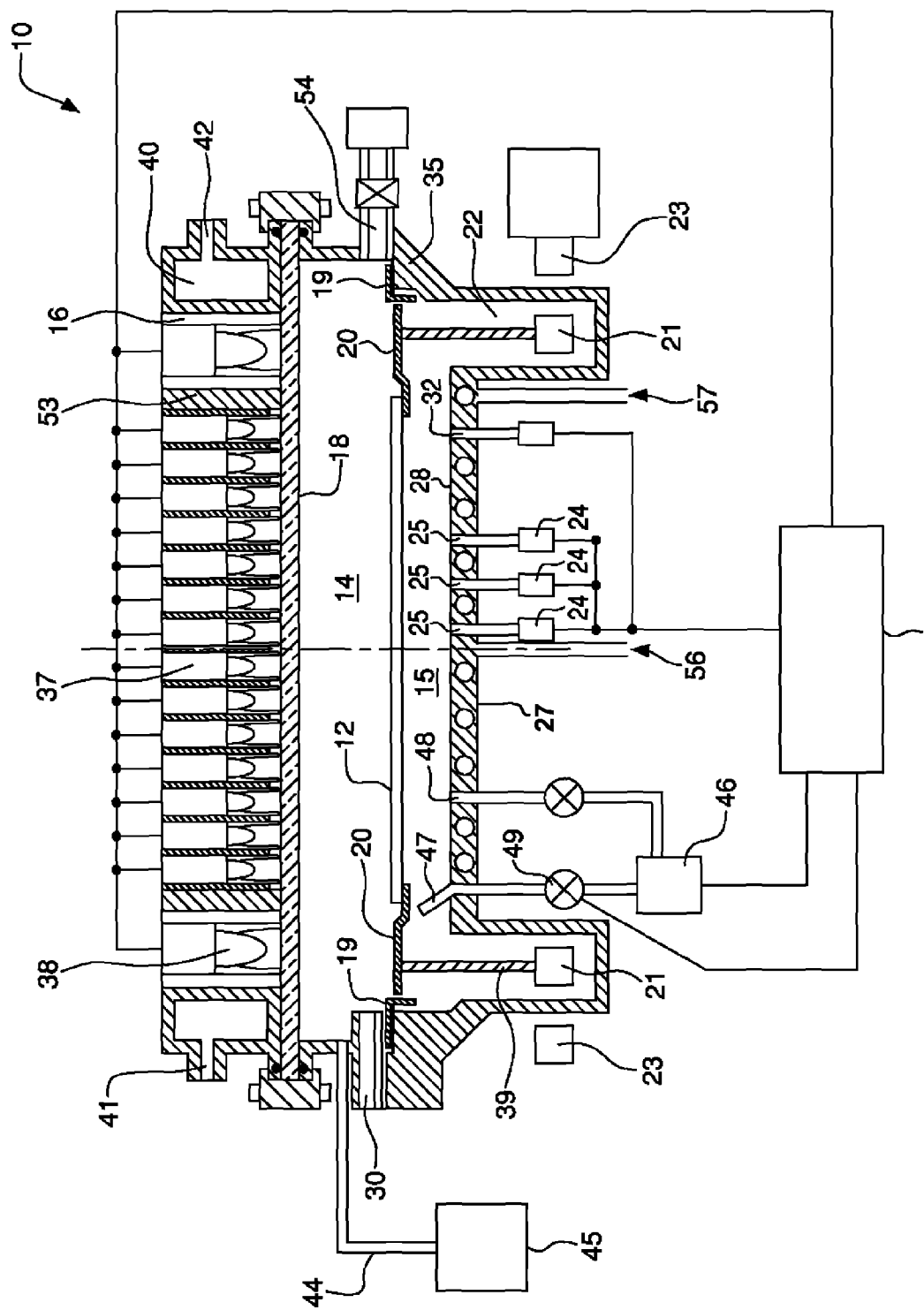
FIG. 2 schematically illustrates a sectional view of a rapid thermal processing system in accordance with one embodiment of the present invention.

FIG. 2 schematically illustrates a sectional view of a rapid thermal processing system 10 in accordance with one embodiment of the present invention. The rapid thermal processing system 10 comprises a chamber body 35 defining a processing volume 14 configured for annealing a disk-shaped substrate 12 therein. The chamber body 35 may be made of stainless steel and may be lined with quartz. The processing volume 14 is configured to be radiantly heated by a heating assembly 16 disposed on a quartz window 18 of the rapid thermal processing system 10. In one embodiment, the quartz window 18 may be water cooled.

A slit valve 30 may be formed on a side of the chamber body 35 providing a passage for the substrate 12 to the processing volume 14. A gas inlet 44 may be connected to a gas source 45 to provide processing gases, purge gases and/or cleaning gases to the processing volume 14. A vacuum pump 53 may be fluidly connected to the processing volume 14 through an outlet 54 for pumping out the processing volume 14.

A circular channel 22 is formed near the bottom of the chamber body 35. A magnetic rotor 21 is disposed in the circular channel 22. A tubular riser 39 rests on or otherwise coupled to the magnetic rotor 21. The substrate 12 is supported by a peripheral edge by an edge ring 20 disposed on the tubular riser 39. A magnetic stator 23 is located externally of the magnetic rotor 21 and is magnetically coupled through the chamber body 35 to induce rotation of the magnetic rotor 21 and hence of the edge ring 20 and the substrate 12 supported thereon. The magnetic stator 23 may be also configured to adjust the elevations of the magnetic rotor 21, thus lifting the substrate 12 being processed. Additional magnetic rotation and levitation information is available in the U.S. Pat. No. 6,800,833, which is hereby incorporated by reference.

The chamber body 35 may include a reflector plate 27 near the back side of the substrate 12. The reflector plate 27 has an optical reflective surface 28 facing the back side of the substrate 12 to enhance the emissivity of the substrate 12. In one embodiment, the reflector plate 27 may be water cooled. The reflective surface 28 and the back side of the substrate 12 define a reflective cavity 15. In one embodiment, the reflector plate 27 has a diameter slightly larger than the diameter of the substrate 12 being processed. For example, if the rapid thermal processing system 10 is configured to process 12 inch substrates, the diameter of the reflector plate 27 may be about 13 inches.

A purge gas may be provided to the reflector plate 27 through a purge gas inlet 48 connected to a purge gas source 46. The purge gas ejected to the reflector plate 27 helps cooling of the reflector plate 27 especially near the apertures 25 where heat is not reflected back to the substrate 12 The purge gas also is believed to counter diffusion of contaminants created from the upstream process which deposit on the pyrometer probes 24 and the reflector plate 27.

In one embodiment, an outer ring 19 may be coupled between the chamber body 35 and the edge ring 20 to separate the reflective cavity 15 from the processing volume 14. The reflective cavity 15 and the processing volume 14 may have different environments.

The heating assembly 16 may comprise an array of heating elements 37. The array of heating elements 37 may be UV lamps, halogen lamps, laser diodes, resistive heaters, microwave powered heaters, light emitting diodes (LEDs), or any other suitable heating elements both singly or in combination. The array of heating elements 37 may be disposed in vertical holes formed in a reflector body 53. In one embodiment, the heating elements 37 may be arranged in a hexagon pattern. A cooling channel 40 may be formed in the reflector body 53. A coolant, such as water, may enter the reflector body 53 from an inlet 41, travel adjacent the vertical holes cooling the array of heating elements 37, and exit the reflector body from an exit 42.

The array of heating elements 37 are connected to a controller 52 which is capable of adjusting heating effects of the array of heating elements 37. In one embodiment, the array of heating elements 37 may be divided into a plurality of heating groups to heat the substrate 12 by multiple concentric zones. Each heating group may be controlled independently to provide desired temperature profile across a radius of the substrate 12. Detailed descriptions of the heating assembly 16 may be found in U.S. Pat. Nos. 6,350,964 and 6,927,169, which are hereby incorporated by reference.

As used herein, rapid thermal processing or RTP refers an apparatus or a process capable of uniformly heating a wafer at rates of about 50° C./second and higher, for example, at rates of 100° to 150° C./second, and 200° to 400° C./second. Typical ramp-down (cooling) rates in RTP chambers are in the range of 80-150° C./second. Some processes performed in RTP chambers require variations in temperature across the substrate of less than a few degrees Celsius. Thus, an RTP chamber must include a lamp or other suitable heating system and heating system control capable of heating at rate of up to 100° to 150° C./second, and 200° to 400° C./second distinguishing rapid thermal processing chambers from other types of thermal chambers that do not have a heating system and heating control system capable of rapidly heating at these rates.

In one embodiment, an edge ring heating assembly 38 configured primarily to heat the edge ring 20 may be disposed outside the array of heating elements 37. The edge ring heating assembly 38 is connected to the controller 52 which may adjust the heating power of the edge ring heating assembly 38. The edge ring heating assembly 38 is independently controllable from the array of heating elements 37, hence controlling the temperature of the edge ring 20 independently from the temperature of the substrate 12. In one embodiment, the edge ring heating assembly 38 may be one of the heating groups of the array of heating elements 37.

The rapid thermal processing system 10 further comprise a plurality of thermal probes 24 configured to measure thermal properties of the substrate 12 at different radial locations. In one embodiment, the plurality of thermal probes 24 may be a plurality of pyrometers optically coupled to and disposed in a plurality of apertures 25 formed in the reflector plate 27 to detect a temperature or other thermal properties of a different radial portion of the substrate 12. Detailed description of similar temperature probes may be found in the U.S. Pat. No. 5,755,511, which is hereby incorporated by reference. The plurality of temperature probes 24 is connected with the controller 52 which may conduct a closed loop control to adjust the power supplies to the array of heating elements 37 to provide a tailored radial thermal profile across the substrate 12.

The rapid thermal processing system 10 further comprises an edge ring thermal probe 31 coupled to and disposed in an aperture 32 on the reflector plate 27 near the edge ring 20. The edge ring thermal probe 31 may be a pyrometer configured to measure a temperature or other thermal properties of the edge ring 20. The edge ring thermal probe 31 is connected with the controller 52 which is connected to the edge ring heating assembly 38. The controller 52 may conduct a closed loop control to the edge ring heating assembly 38 using the measurement from the edge ring thermal probe 31 alone or in combination with the wafer probes 24. In one embodiment, the edge ring 20 may be heated to a desired temperature independently from the substrate 12 during a thermal process.

A gas jet 47 may be disposed near the edge ring 20 for cooling the edge ring 20. In one embodiment, the gas jet 47 may share the same purge gas source 46 with the purge gas inlet 48. The gas jet 47 may be directed to the edge ring 20 and ejecting a cooling gas, such as helium, to cool the edge ring 20. The gas jet 47 may be connected to the purge gas source 46 through a valve 49 which may be controlled by the controller 52. The controller 52, therefore, may include the cooling effect of the gas jet 47 in the closed looped temperature control of the edge ring 20.

The edge ring 20 may be designed to have thermal properties, such as thermal mass, emissivity and absorptivity, according to the thermal properties of the substrate 12 being processed to improve substrate temperature profile. The thermal properties of the edge ring 20 may be altered by choosing different materials, different thicknesses and different coatings. A detailed description of edge ring design may be found in the U.S. Pat. No. 7,127,367, which is hereby incorporated by reference. In one embodiment, the edge ring 20 may be made from silicon with a nickel coating.

During a rapid thermal process, the substrate 12 may be transferred to the processing volume 14 through the slit valve 30 and supported by the edge ring 20. The magnetic rotor 21 may rotate the substrate 12 and position the substrate 12 in a desired elevation. During most processes, the objective is to rapidly heat the substrate 12 uniformly to a target temperature. In one embodiment of the present invention, heat transfer to the substrate 12 mainly comes from radiation of the array of heating elements 37 and conduction and/or radiation from the edge ring 20 which is heated in a desired temperature. A uniform temperature profile across the substrate 12 may be achieved by controlling the array of heating elements 37 and by keeping the edge ring 20 at the desired temperature which is usually different than the target temperature for the substrate 12.

Controlling the array of heating element 37 may be conducted by measuring the temperature of the substrate 12 across a radius using the plurality of thermal probes 24. In one embodiment, the plurality of thermal probes 24 may be evenly distributed across the reflector plate 27 corresponding to a radius of the substrate 12. The measured temperatures from the plurality of thermal probes 24 are sampled by the controller 52. The controller 52 may used the measured temperatures to adjust the array of heating elements 37 so that the temperature across a radius of the substrate 12 becoming uniform. In one embodiment, the controller 52 may adjust the array of heating elements 37 by a plurality of concentric zones. Detailed descriptions of controlling heating elements by multiple zones may be found in U.S. Pat. No. 5,755,511 and U.S. patent application Ser. No. 11/195,395, published as United States Patent Application Publication No. 2006/0066193, which are hereby incorporated by reference.

In one embodiment, heat exchange between the edge ring 20 and a periphery of the substrate 12 is used to adjust the temperature profile near the edge of the substrate 12. Heat exchange may be achieved by conduction and/or radiation between the substrate 12 and the edge ring 20. In one embodiment, heat exchange may be conducted by heating the edge ring 20 to a temperature different from the target temperature of the substrate 12.

In one embodiment, a desired temperature may be predetermined for the edge ring 20 according to process requirements and thermal properties of both the edge ring 20 and the substrate 12. In one embodiment, the predetermined desired temperature of the edge ring 20 may be about 10° C. to about 15° C. different from the target temperature of the substrate 12. In one embodiment, the predetermined desired temperature of the edge ring 20 may be higher than the target temperature of the substrate 12. In another embodiment, the predetermined desired temperature of the edge ring 20 may be lower than the target temperature of the substrate 12. The desired edge ring temperature may be determined from either heat transfer modeling (conductive, radiative, convective) or from experimental results. In either case, the optical properties of the substrate and/or the edge ring are varied and the temperature uniformity of the wafer is measured. The results of these experiments lead to prediction of the desired temperature profile for the edge ring to achieve the best uniformity on the substrate.

In another embodiment, the desired temperature for the edge ring 20 may be dynamic and adjustable according to the in-situ thermal measurements of the substrate 12 and the edge ring 20.

Heating the edge ring 20 may be achieved primarily by using the edge ring heating assembly 38. A closed loop control may be achieved by the controller 52 by adjusting the temperature of the edge ring 20 from the measurement of the edge ring thermal probe 31. Adjustment of the temperature of the edge ring 20 may be achieved by adjusting the power supply of the edge ring heating assembly 38 and/or flow rate of the cooling gas from the gas jet 47. In one embodiment, the edge ring 20 may be over heated and then cooled down to a desired temperature with cooling gas from the gas jet 47.

In one embodiment of the present invention, the cooling gas for the gas jet 47 may be used to cool the edge ring 20 to between about 100° C. and about 200° C. after processing one substrate and prior to the entry of the next substrate.

The method of the present invention can provide less than 2° C., 3 sigma temperature uniformity for spike annealing. The method of the present invention provide less than 1° C., 3 sigma temperature uniformity for high temperature soak annealing up to 1350° C. In one embodiment, it is believed that the method of the present invention is capable of heating a substrate at a temperature between about 200° C. to about 1350° C. with a temperature deviation of about 1° C. to about 1.5° C.*

The edge ring heating element 38 of the rapid thermal processing system 10 is illustrated as a plurality of heating lamps. Other suitable heating device, such as for example solid state heaters (i.e., LEDs), laser heaters, inductive heaters, and microwave heaters, electrical heaters (e.g., resistive heating) can be used in the rapid thermal processing systems of the present invention.

Figure 3:
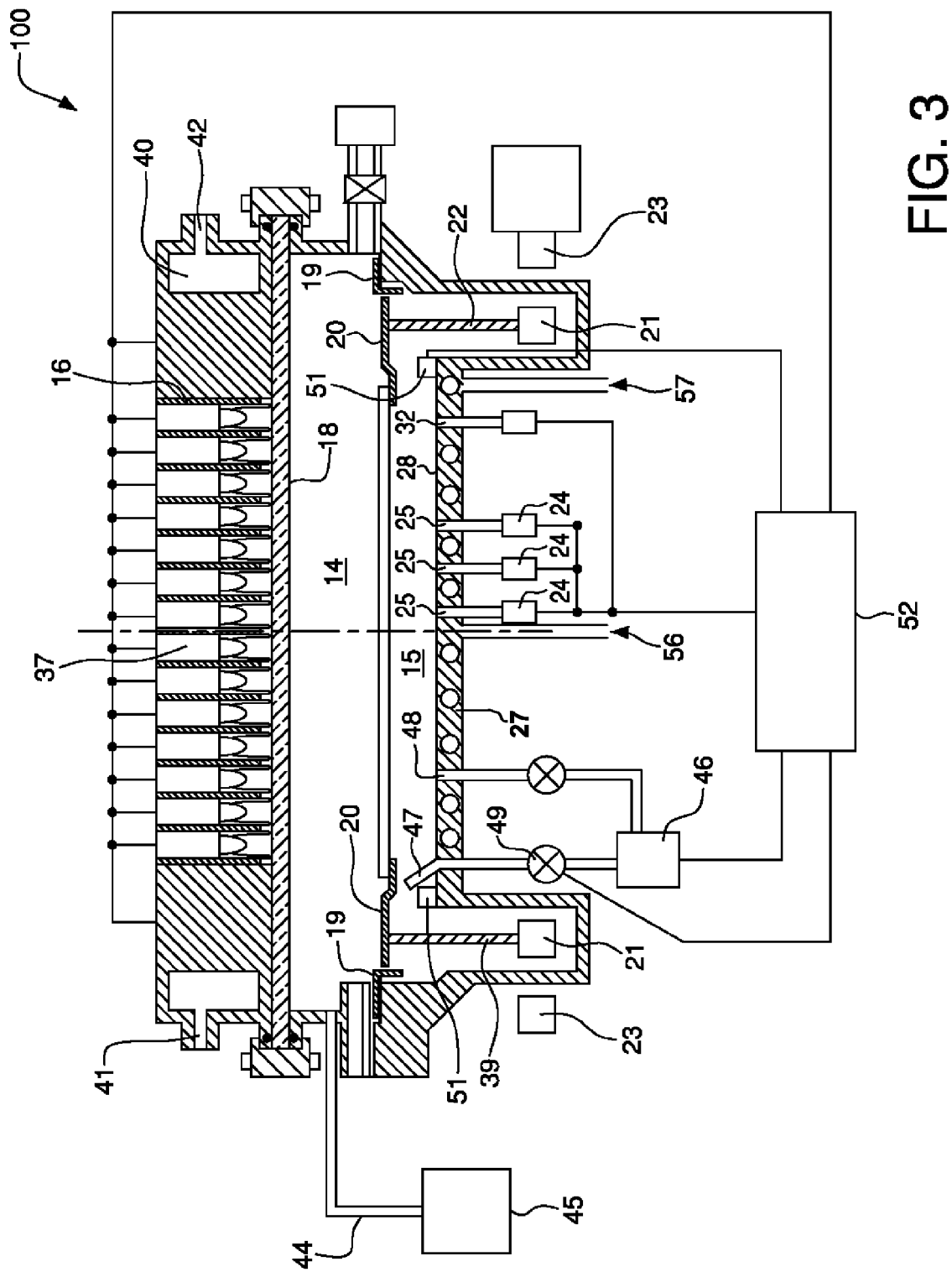
FIG. 3 schematically illustrates a sectional view of a rapid thermal processing system in accordance with another embodiment of the present invention.

Additionally, the edge ring heating element may be positioned in other suitable locations, such as underneath the edge ring, on a side of the edge ring. FIG. 3 schematically illustrates a sectional view of a rapid thermal processing system 100 having an edge ring heating element 51 positioned below the edge ring 20.

In another embodiment, a substrate may be heated from a backside during thermal processing. An exemplary backside heating chamber may comprise an edge ring for supporting the substrate by a periphery with a frontside (the production side) facing up. An array of heating elements, similar to the heating elements 37, may be positioned underneath the edge ring so that the substrate can be heated from the backside. A plurality of probes may be positioned across the radius of the substrate above the edge ring to measure a temperature profile of the substrate during thermal processing. An edge ring heater dedicated to independently heat the edge ring may be positioned near the edge ring, underneath the edge ring, above the edge ring, or on a side of the edge ring. An edge ring probe may be positioned adjacent the edge ring configured to measure the temperature of the edge ring. A controller may be connected to the edge ring heater, the edge ring probe, the array of heating elements and the plurality of probes to control the temperature profile of the substrate and the temperature of the edge ring in-situ.

Figure 4:
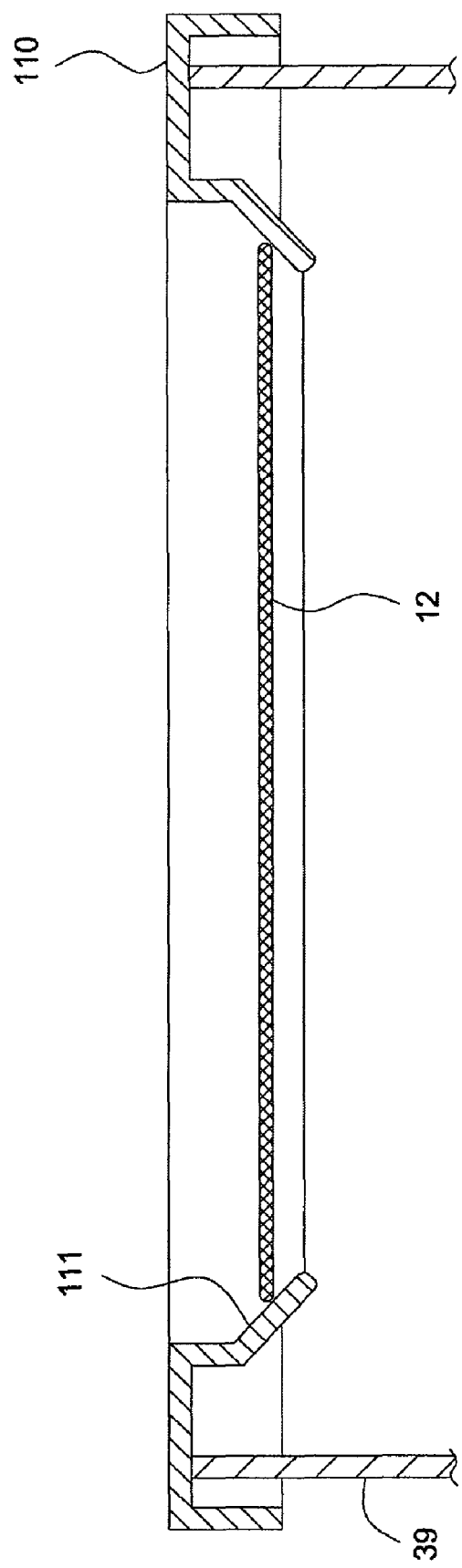
FIG. 4 schematically illustrates a sectional view of an edge ring in accordance with one embodiment of the present invention.

FIG. 4 schematically illustrates a sectional view of an edge ring 110 in accordance with one embodiment of the present invention. The edge ring 110 has a slant lip 111 configured to support the substrate 12. The edge ring 110 is designed to reduce the contact area with the substrate 12. By reducing the contact area between the substrate 12 and the edge ring 110, the heating condition near the edge of the substrate 12 may be simplified and edge high/low effect may be reduced. Additionally, reducing contact area also reduces particle contamination in the processing chamber.

Figure 5:
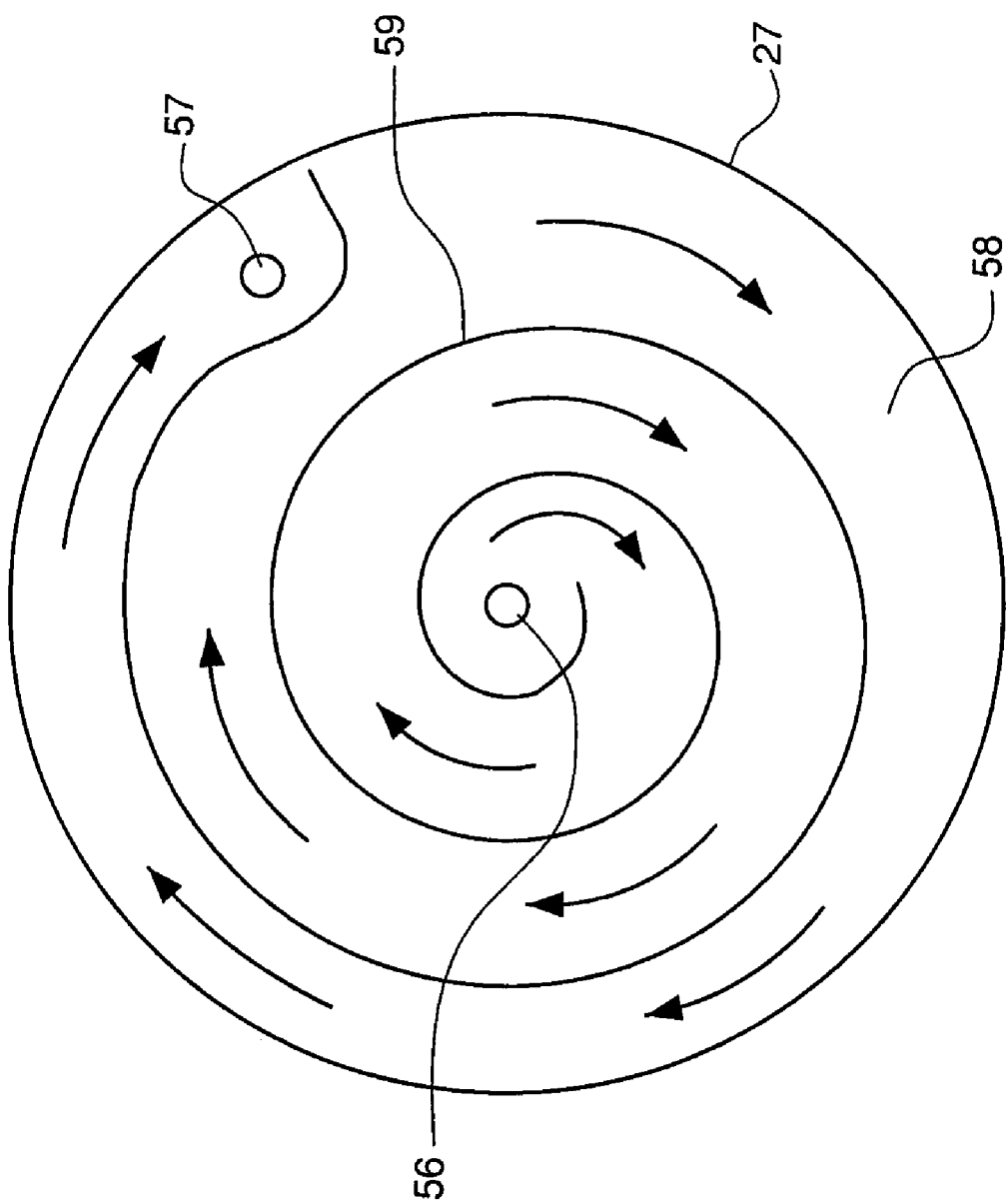
FIG. 5 is a top plan view of a plate having channels through the plate to provide a heating or cooling fluid through the channels.

FIG. 5 schematically illustrates a reflector plate 27 according to one or more embodiments of the invention where the reflector plate 27 contains a channel 58 defined by channel walls 59. In these embodiments, the reflector plate 27 has an inlet 56 and an outlet 57, and liquid or gas can flow through the reflector plate along the path of the arrows displayed in the figure. In other embodiments, the inlet and outlet are reversed, thereby reversing the flow of liquid or gas through the reflector plate. The liquid or gas of these embodiments can be employed to cool the reflector plate, heat the reflector plate, or control the temperature of the reflector plate so that the reflector plate can be used to heat or cool the edge ring as described further below.

Thus, according to one or more embodiments, in the apparatus shown in FIGS. 2 and 3, the edge ring 20 is heated or cooled by being in close proximity to a reflector plate 27 which is heated or cooled to a degree sufficient to affect the temperature of the edge ring to decrease the temperature difference between the edge ring and reflector plate. In one embodiment, during processing of a substrate, after the substrate and edge ring are cool enough (e.g., about 500° C.) to remove the substrate, the substrate is removed from the chamber, and the edge ring is moved in close proximity to the reflector plate which is being cooled and cools the edge ring to a temperature close to about 100° C. Cooling the edge ring to about 100° C. will enable a new room temperature substrate to be placed on the cooled edge ring immediately, which will increase substrate processing throughput. This could also be accomplished by moving part of reflector plate in close proximity or touching the edge ring. Thus, the temperature of the edge ring can be controlled during two parts of the process: 1) during substrate processing to control wafer temperature uniformity and 2) to cool the edge ring after substrate processing when the wafer is not in chamber to enhance throughput. Movement of the edge ring in proximity to the heating/cooling plate could be accomplished by using a substrate support that is adapted move up and down within the chamber.

Thus, the reflector plate is a thermal mass that can be used to change the temperature of the edge ring. In additional embodiments, the edge ring 20 can be heated or cooled by a combination of temperature regulated gases and close proximity to a temperature controlled reflector plate. In other embodiments, a separate thermal mass or plate can be provided adjacent the edge ring 20. In certain embodiments, the thermal mass can be located between the reflector plate and the edge ring. In such embodiments, it may be desirable for the thermal mass to be in the shape of a toroid or donut so that the thermal mass does not interfere with the reflector plate 27. Similar to the embodiment described above, fluid channels can be provided in the thermal mass to allow cooling or heating fluid to flow through the thermal mass.

Although the above discussion is focused on achieving uniform temperature profile across a substrate, a non-uniform temperature profile could also be achieved using the apparatus and methods of the present invention.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

The invention claimed is:

1. A chamber for processing a substrate, comprising:
a chamber enclosure defining a processing volume;
a substrate support disposed in the processing volume;
an edge ring disposed on the substrate support, the edge ring to support the substrate on a periphery of the substrate during processing;
a first heat source including an array of heating elements and a reflector to heat the substrate;
a second heat source dedicated to change the temperature of the edge ring;
an edge ring thermal probe and wafer thermal probes, the first heat source, the second heat source and the edge ring thermal probe and wafer thermal probes connected to a controller to heat and cool the edge ring independently of the substrate and to minimize the difference in temperature between the edge ring and the wafer; and
a thermal mass positioned adjacent the edge ring including at least one channel containing a fluid that heats or cool the thermal mass, the edge ring and the thermal mass being movable with respect to each to cool and heat the edge ring to decrease a temperature difference between the edge ring and the thermal mass.

2. The chamber of claim 1, wherein the temperatures of the second heat source and the thermal mass are controlled independently.

3. The chamber of claim 1, wherein the edge ring is cooled by positioning the edge ring proximate to the thermal mass.

4. The chamber of claim 2, wherein the second heat source is one of a radiant heater, a conductive heat source, a resistive heater, an inductive heater, and a microwave heater.

5. The chamber of claim 1, further comprising a gas jet configured to direct a cooling gas towards the edge ring.

6. The chamber of claim 1, wherein the first heat source and thermal mass are disposed on opposite sides of the edge ring.

7. The chamber of claim 1, wherein the first heat source and thermal mass are disposed on the same side of the edge ring.

8. The chamber of claim 1, wherein the thermal mass comprises a reflector plate.

9. The chamber of claim 1, wherein the thermal mass is in the shape of a toroid.

10. A rapid thermal processing chamber, comprising:
a chamber body defining a chamber volume;
a temperature controlled edge ring disposed in the chamber volume, wherein the temperature controlled edge ring is thermally coupled with a substrate being processed near the periphery of the substrate;
a first heat source including an array of heating elements and a reflector to primarily change the temperature of the substrate;
a second heat source dedicated to heating the temperature controlled edge ring;
an edge ring thermal probe and wafer thermal probes, the first heat source, the second heat source and the edge ring thermal probe and wafer thermal probes connected to a controller to heat and cool the edge ring independently of the substrate and to minimize the difference in temperature between the edge ring and the wafer; and
a plate adjacent the edge ring having at least one channel containing a gas or liquid for heating or cooling the plate, the edge ring and the plate being movable with respect to each other to cool and heat the edge ring to decrease a temperature difference between the edge ring and the plate.

11. The rapid thermal processing chamber of claim 10, further comprising a cooling device directed to cool the temperature controlled edge ring.

12. The rapid thermal processing chamber of claim 11, wherein the first heat source and plate are disposed on opposite sides of the temperature controlled edge ring.

13. The rapid thermal processing chamber of claim 11, wherein the edge ring is cooled by being in close proximity to the plate.

14. The rapid thermal processing chamber of claim 10 wherein the temperatures of the first heat source, the second heat source and the plate are controlled independently.

15. The rapid thermal processing chamber of claim 12, wherein the plate is in the shape of a toroid.

16. The rapid thermal processing chamber of claim 12, wherein the plate comprises a reflector plate.

17. A method for uniformly heating or cooling a substrate to a target temperature, comprising:
    positioning the substrate in a processing chamber connected to a first heat source;
    thermally coupling the periphery of the substrate to an edge ring;
    heating or cooling a surface of the substrate with a first heat source including an array of heating elements and a reflector; and
    detecting temperature of the edge ring with an edge ring thermal probe and detecting temperature of the substrate with wafer thermal probes;
    heating and cooling the temperature of the edge ring with a second heat source dedicated to heating and cooling the edge ring;
    using a controller connected to the first heat source, the second heat source, the edge ring thermal probe and wafer thermal probes to heat and cool the edge ring with the second heat source independently of the first heat source and to minimize the difference in temperature between the edge ring and the wafer;
    maintaining the edge ring at a ring temperature which differs from the target temperature with a temperature controlled plate adjacent to the edge ring, the temperature controlled plate including channel containing gas or liquid to heat or cool the plate, the edge ring and the plate being movable with respect to each other to cool and heat the edge ring to decrease a temperature difference between the edge ring and the plate.

18. The method of claim 17, wherein maintaining the edge ring at the ring temperature further comprises heating or cooling the edge ring with a second heat source, wherein the first and second heat sources are independently controllable.

19. The method of claim 18, further comprising cooling the edge ring using a purge gas.

* * * * *